United States Patent
Shi et al.

(10) Patent No.: US 10,314,163 B2
(45) Date of Patent: Jun. 4, 2019

(54) LOW CROSSTALK VERTICAL CONNECTION INTERFACE

(71) Applicant: Xilinx, Inc., San Jose, CA (US)

(72) Inventors: Hong Shi, Fremont, CA (US); Siow Chek Tan, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/597,505

(22) Filed: May 17, 2017

(65) Prior Publication Data

US 2018/0338375 A1    Nov. 22, 2018

(51) Int. Cl.
  *H05K 1/02* (2006.01)
  *H05K 1/11* (2006.01)
  *H05K 1/14* (2006.01)
  *H05K 1/18* (2006.01)
  *H01L 23/00* (2006.01)
  (Continued)

(52) U.S. Cl.
  CPC .......... *H05K 1/0228* (2013.01); *H01L 23/48* (2013.01); *H01L 23/49816* (2013.01); *H01L 23/49827* (2013.01); *H01L 23/49838* (2013.01); *H01L 24/09* (2013.01); *H01L 24/17* (2013.01); *H01L 25/0655* (2013.01); *H05K 1/111* (2013.01); *H05K 1/115* (2013.01); *H05K 1/144* (2013.01); *H05K 1/181* (2013.01); *H01L 24/13* (2013.01); *H01L 24/16* (2013.01); *H01L 25/0657* (2013.01); *H01L 2224/131* (2013.01); *H01L 2224/16145* (2013.01);
  (Continued)

(58) Field of Classification Search
  CPC .......... H01L 23/49838; H01L 25/0657; H01L 24/06; H01L 23/49816; H01L 2924/14; H01L 2924/00014; H01L 2225/06517; H01L 24/16; H01L 24/13; H01L 23/3128; H01L 23/49827; H01L 2224/16145; H01L 2224/16227; H01L 2224/131; H05K 1/114; H05K 1/181; H05K 1/111; H05K 1/115; H05K 1/144
  See application file for complete search history.

(56) References Cited

U.S. PATENT DOCUMENTS

| 6,914,259 B2 * | 7/2005 | Sakiyama | G01R 31/2853 |
| | | | 257/48 |
| 8,084,297 B1 * | 12/2011 | Joshi | H01L 23/04 |
| | | | 257/499 |

(Continued)

FOREIGN PATENT DOCUMENTS

WO    2009032506    3/2009

*Primary Examiner* — Jasmine J Clark
(74) *Attorney, Agent, or Firm* — Keith Taboada

(57) ABSTRACT

An integrated circuit device having a vertical connection interfaces for coupling stacked components are provided that improve communication between the stacked components. The techniques described herein allow for increased signal connection density while reducing potential for crosstalk. For example, a ground to signal ratio of connections between components in a vertical interface configured to carry ground signals relative to connections configured to carry data signals within a bank of connections has an edge to center gradient which reduces the amount of ground connections needed to meet crosstalk thresholds, while increasing the amount of signal connections available for communication between components across the vertical interface.

20 Claims, 9 Drawing Sheets

(51) Int. Cl.
*H01L 23/48* (2006.01)
*H01L 23/498* (2006.01)
*H01L 25/065* (2006.01)

(52) U.S. Cl.
CPC .............. *H01L 2224/16227* (2013.01); *H01L 2225/06513* (2013.01); *H01L 2225/06517* (2013.01)

(56) References Cited

U.S. PATENT DOCUMENTS

2015/0124419 A1  5/2015  Wong
2018/0184524 A1* 6/2018  Xiong ............... H01L 23/49816

* cited by examiner

| LEGEND | | |
|---|---|---|
| ITEM | SYMBOL | REF |
| SIGNAL PIN | ☐ | 116 |
| GROUND PIN | ☒ | 118 |

| LEGEND | | |
|---|---|---|
| ITEM | SYMBOL | REF |
| SIGNAL PIN | ☐ | 116 |
| GROUND PIN | ⊠ | 118 |

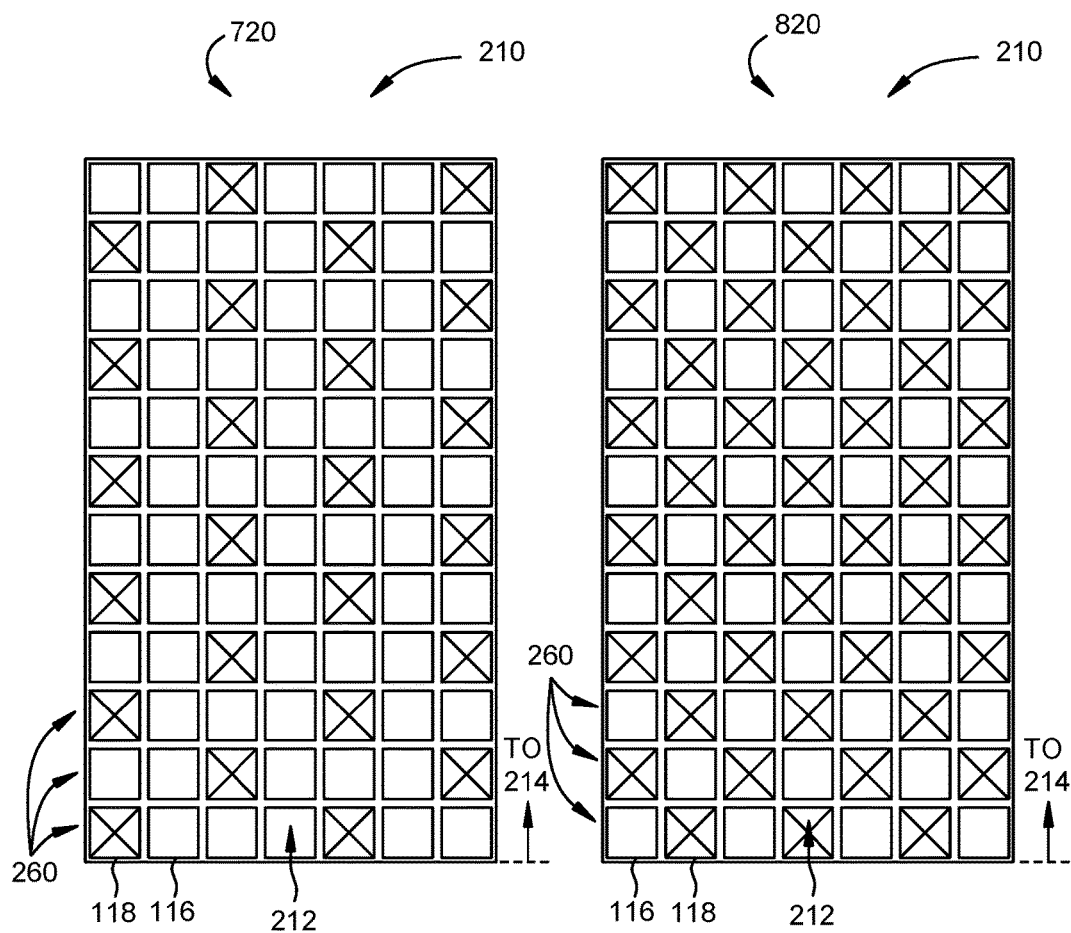

| LEGEND | | |
|---|---|---|
| ITEM | SYMBOL | REF |
| SIGNAL PIN | ☐ | 116 |
| GROUND PIN | ⊠ | 118 |

LOW CROSSTALK VERTICAL CONNECTION INTERFACE

TECHNICAL FIELD

Embodiments of the present disclosure generally relate to chip packages and electronic devices having the same. In particular, to a vertical connection interface between stacked components of chip packages and electronic devices that provide ground and data signal communication between the stacked components.

BACKGROUND ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packages include one or more stacked components such as integrated circuit (IC) dies, through-silicon-via (TSV) interposer, and a package substrate, with the chip package itself stacked on a printed circuit board (PCB). The IC dies may include memory, logic, MEMS, RF or other IC device.

As the number and density of signal transmission routings, such as solder connections, through a vertical interface between any of these stacked components becomes greater, crosstalk between adjacent routings becomes increasingly problematic. The risk of increased crosstalk is also present stacked PCBs.

Conventional escape routing techniques utilized at the interface between chip package components and stacked PCBs generally employ multiple layers for vertically spacing horizontal routings. The thickness of the layers may be selected to reduce crosstalk potential. However, thick layers represent additional cost to the manufacturer, and do not improve crosstalk protection between vertical portions (i.e., vias) of the escape routing.

Therefore, a need exists for an improved vertical connection interfaces between stacked components of chip packages and PCBs that reduces crosstalk potential as compared what is conventionally utilized in the art.

SUMMARY

Electronic devices having vertical connection interfaces for stacking components of chip packages are provided that improve communication between the stacked components.

In one example, an integrated circuit device is provided that includes a first integrated circuit component. The first component includes escape routing terminating at a plurality of first exposed conductors exposed on a first surface of the first component. The first exposed conductors are arranged in a plurality of rows that include at least a first row, a second row and a third row all extending through a first bank defined among a portion of the plurality of first exposed conductors. The first row is disposed parallel and adjacent to a first edge of the first surface. The third row is spaced away from the first edge. The second row is disposed between the first row and the third row. A ground to signal ratio of the first exposed conductors configured to carry ground signals relative to the first exposed conductors configured to carry data signals within the first bank is greater in the third row relative to the first row.

In another example, an integrated circuit device is provided that includes a first integrated circuit component. The first integrated circuit component includes escape routing terminating at a plurality of first exposed conductors exposed on a first surface of the first component. The first exposed conductors are exposed on the first surface and are arranged in a plurality of rows extending through a first bank defined among a portion of the plurality of first exposed conductors. A ground to signal ratio of the first exposed conductors configured to carry ground signals relative to the first exposed conductors configured to carry data signals within the first bank has an edge to center gradient.

In another example, an integrated circuit device is provided that includes a second component stacked below and coupled to a first component by a plurality of solder connections. The first component includes circuitry terminating at a plurality of first exposed conductors exposed on a first surface of the first component. The second component includes escape routing terminating at a plurality of second exposed conductors exposed on a second surface of the second component. The second exposed conductors are exposed on the second surface and are arranged in a plurality of rows extending through a first bank defined among a portion of the plurality of second exposed conductors. A ground to signal ratio of the second exposed conductors configured to carry ground signals relative to the second exposed conductors configured to carry data signals within the first bank has an edge to center gradient.

In another example, method for determining an escape routing is provided. The method includes (A) inputting a threshold crosstalk tolerance; (B) determining a first ground to data signal (GDS) ratio for connections coupled through first vias having a first depth in response to the threshold crosstalk tolerance; (C) determining a second GDS ratio for connections coupled through second vias having a second depth in response to the threshold crosstalk tolerance, the first depth greater than the second depth, and the first GDS greater than the second GDS; and (D) determining a third GDS ratio for connections coupled through third vias having a third depth in response to the threshold crosstalk tolerance, the second depth greater than the third depth, and the second GDS greater than the third GDS.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 is a schematic illustration of one example of an interface layout for a vertical interface between components having a ground to signal ratio of 1:3.

FIG. 8 is a schematic illustration of one example of an interface layout for a vertical interface between components having a ground to signal ratio of 1:1.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosure generally provide vertical connection interfaces between stacked components of chip packages and electronic devices that improve communication between the stacked components. The techniques described herein allow for increased signal connection density while reducing the potential for crosstalk. Specifically, the vertical connection interfaces utilize more ground connections in regions having deeper vias as compared to regions having shallower vias. As the regions of deeper vias are typically located away from edges of escape routings, a ground to signal ratio of connections between components in a vertical interface configured to carry ground signals relative to connections configured to carry data signals within a bank of connections has an edge to center gradient. Stated differently, rows of connections further from a component edge of an escape routing generally have a higher ground to signal ratio of connections between conductors in a vertical interface relative to rows of connections closer to the component edge. Advantageously, the ground to signal ratio gradient reduces the amount of ground connections needed to meet crosstalk thresholds, while increasing the amount of signal connections available for communication between components across the vertical interface.

Figure 1:
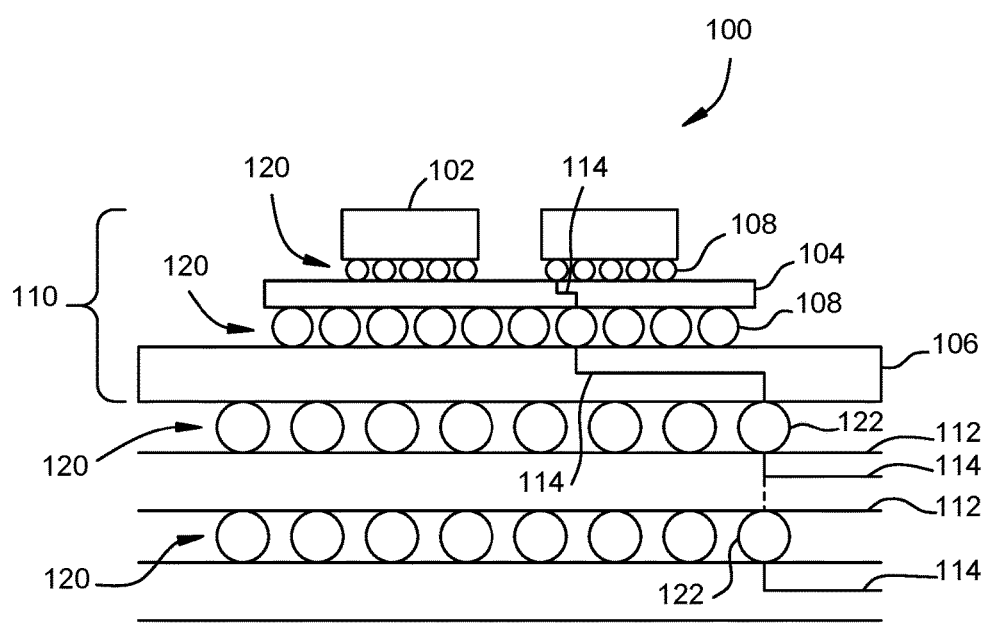
FIG. 1 is a cross sectional schematic view of an integrated chip package mounted on a printed circuit board illustrating a number of vertical interfaces between components.

Turning now to FIG. 1, an integrated circuit electronic device 110 is schematically illustrated having an exemplary integrated chip (IC) package 100 mounted on a printed circuit board (PCB) 112 illustrating a number of vertical interfaces 120 between components. The components between which a vertical interfaces 120 may be defined include the IC package 100 and PCB 112 themselves; at least two of an IC die 102, an optional through-substrate-via (TSV) interposer 104, and a package substrate 106; and two stacked PCBs 112. The IC dies 102 may be programmable logic devices, such as field programmable gate arrays (FPGA), memory devices, optical devices, processors or other IC logic structures. Optical devices include photodetectors, lasers, optical sources, and the like.

In one example, the chip package 100 includes one or more IC dies 102 that may be connected directly to the package substrate 106, for example as flip chip ball grid array (FCBGA), ball grid array (BGA), wire bond and the like. In another alternative example, the chip package 100 may be configured to have two or more IC dies 102 in a vertically stacked configuration, also known as a 3D or stacked die package. In one example, the chip package 100 includes one or more IC dies 102 that may be connected via the interposer 104 to the package substrate 106. It is contemplated that the chip package 100 may have other configurations. Although one IC die 102 is shown in FIG. 1, the number of IC dies may range from one to as many as can be fit within the chip package 100 in order to meet design criteria.

The interposer 104 includes circuitry 114 for electrically connecting the circuitry of the IC die 102 to circuitry 114 of the package substrate 106. The circuitry 114 of the interposer 104 may optionally include transistors. Solder connections 108, such as micro-bumps, may be utilized to mechanically and electrically connect the circuitry of the IC die 102 to the circuitry 114 of the interposer 104. Solder connections 108, such as package bumps (i.e., "C4 bumps,") are utilized to provide an electrical connection between the circuitry 114 of the interposer 104 and the circuitry 114 of the package substrate 106. The package substrate 106 may be mounted and electrically connected to the PCB 112, utilizing solder connections 122, such as solder balls, wire bonding or other suitable technique. When two PCBs 112 are optionally stacked, the circuitry 114 of one of the PCBs 112 may be coupled to the circuitry 114 of the other PCB 112 utilizing solder connections 122. The solder connections 108, 122 connect the facing surfaces of adjacent components comprising the vertical interfaces 120.

Figure 2:
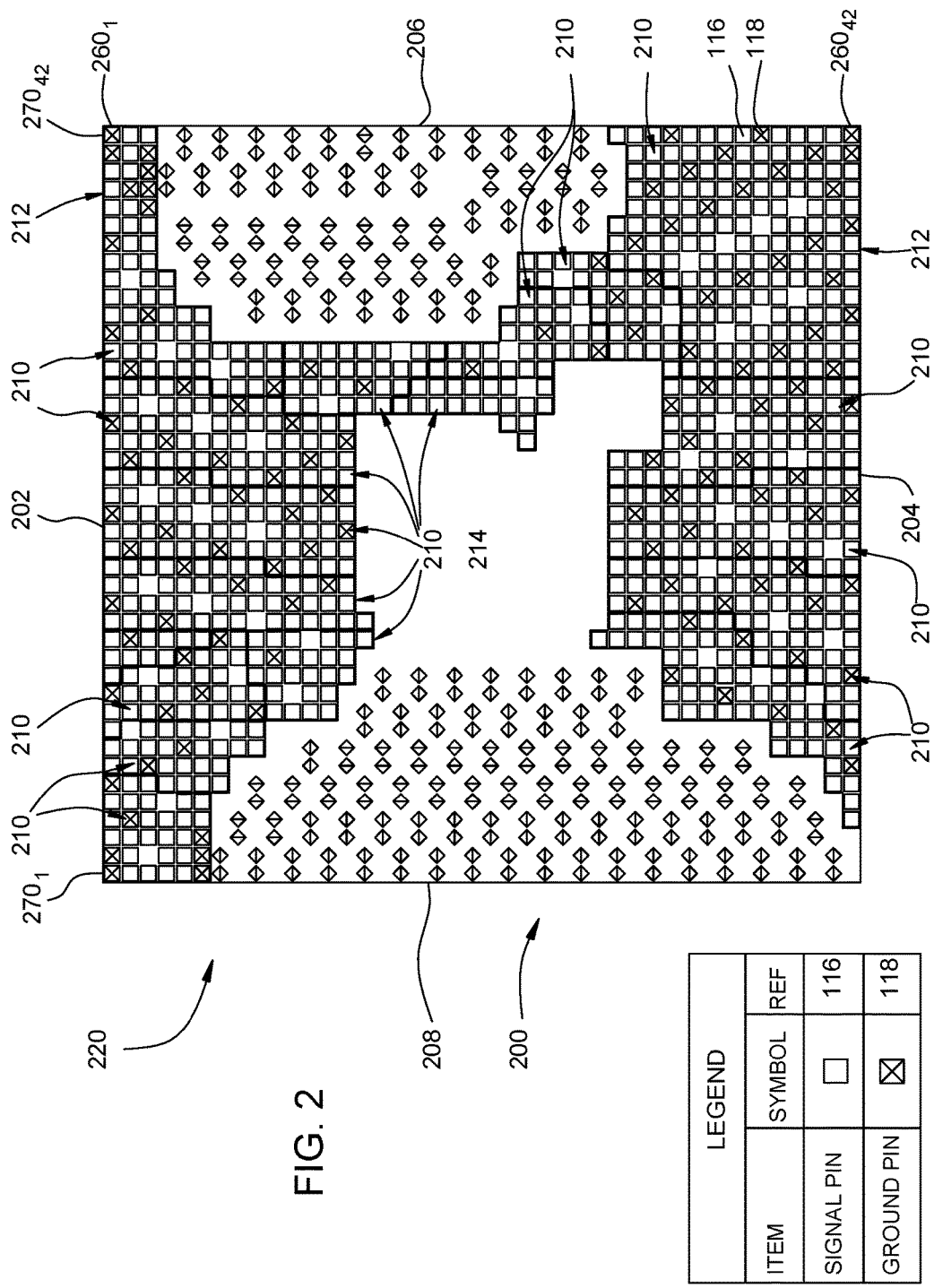
FIG. 2 is a schematic illustration of an interface layout of one example for a vertical interface between components such as shown in FIG. 1.

FIG. 2 is a schematic illustration of an interface layout 200 of one example for a vertical interface 220. The vertical interface 220 may be any of the vertical interfaces 120 between components such as shown in FIG. 1, or between other vertically stacked components of an integrated circuit device. In the example depicted in FIG. 2, the interface layout 200 is that of an exemplary BGA.

The interface layout 200 is generally shown taken through the solder connections (such as connections 108 or 122 in FIG. 1) between facing surfaces of the components defining the interface. The interface layout 200 is generally bounded by edges 202, 204, 206, 208 that correspond to the edges of the component making up the interface 220 that does not include escape routing. The interface layout 200 also includes edge regions 212 disposed proximate the edges 202, 204, 206, 208, and a central interior region 214 surrounded by the edge regions 212.

In FIG. 2, the solder connections are schematically illustrated as signal pins 116 and ground pins 118. The pins 116 and ground pins 118 also representative of the exposed conductors, i.e., exposed metallization or bond pads, formed on the facing surfaces of the components comprising the interface 220. The signal and ground pins 116, 118 are shown grouped in banks 210 of connections. Each bank 210 or groups of banks 210 generally handle the electrical connections to a specific one of the dies 102 of the IC package 100. Power connections are not shown and typically are disposed in the interior region 214 of the layout 200. The banks 210 generally are located the edge regions 212 of the layout 200. Other connections shown as diamonds in FIG. 2 provide other connections. The banks 210 may be concentrated along opposing edges 202, 204.

The signal and ground pins 116, 118 are also arranged in rows $260_X$ and columns $270_Y$ across the interface 220, wherein X and Y are integers. For example, the pins 116, 118 comprising a row 260 of solder connections of the interface 220 are generally arranged in an orientation that is substantially parallel to the edges 202, 204. Similarly, the pins 116, 118 comprising a column 270 of solder connections of the interface 220 are generally arranged in an orientation that is substantially parallel to the edges 206, 208. In the embodiment depicted in FIG. 2, forty-two rows 260 and forty-two column 270 are illustrated.

Figure 3:
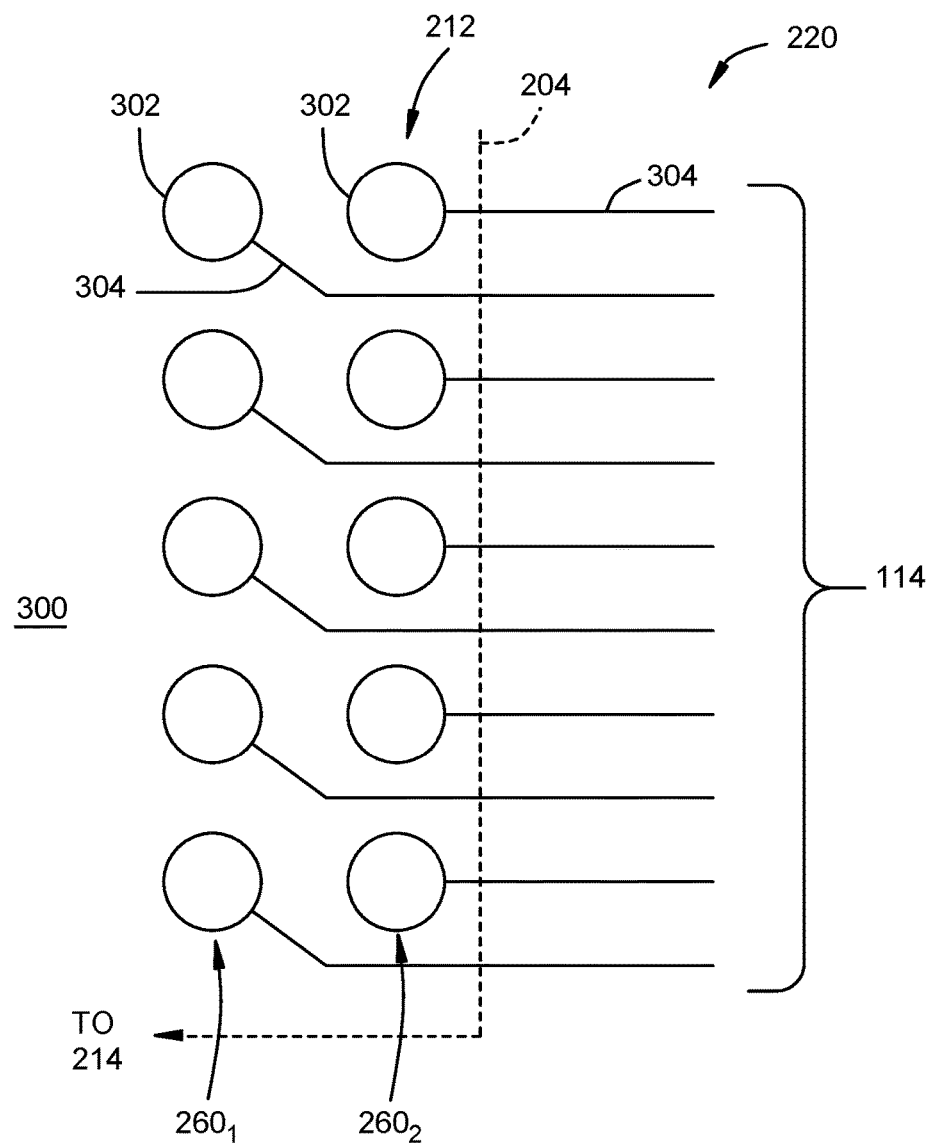
FIG. 3 is a top schematic view of an example of a portion of an escape routing for the interface layout of FIG. 2.
Figure 4:
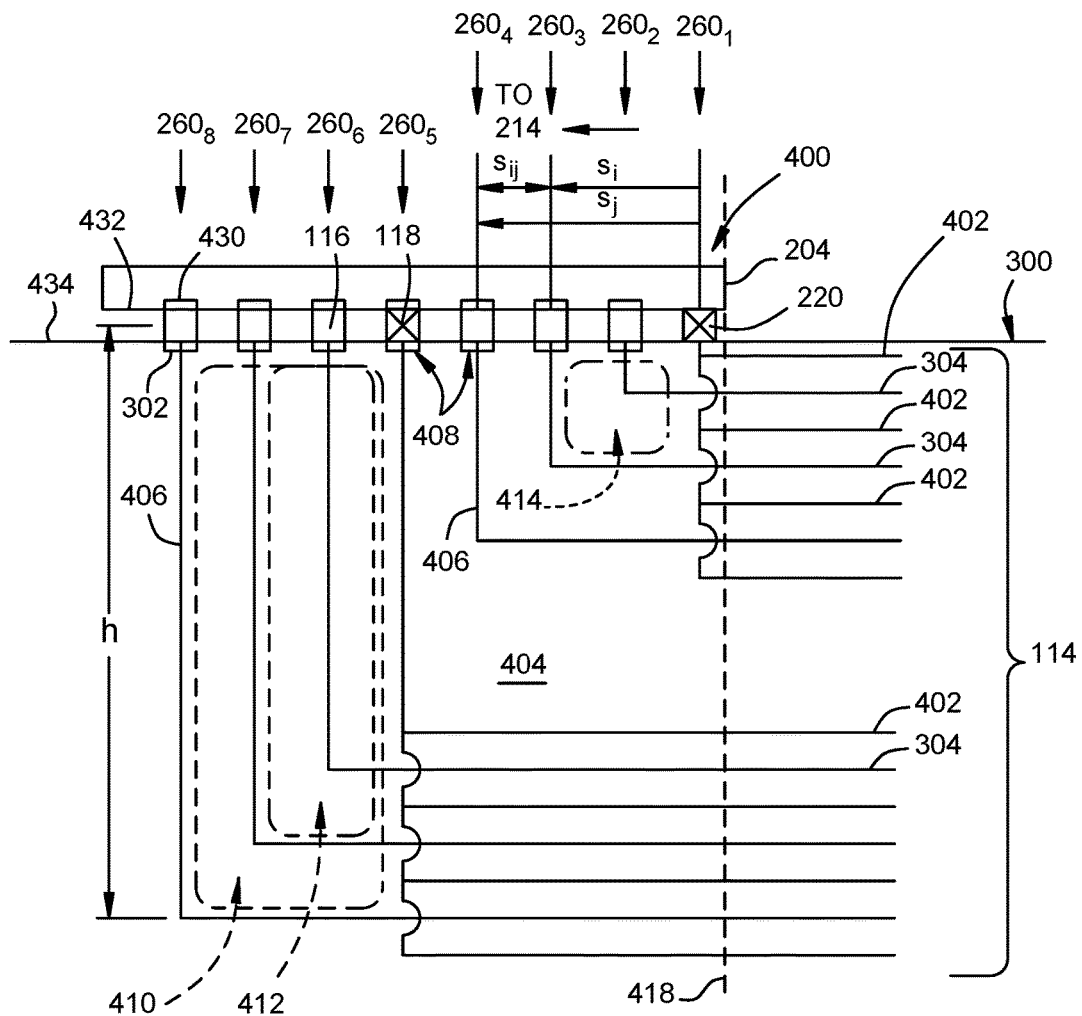
FIG. 4 is a schematic sectional view of an example of a portion of an escape routing for the interface layout of FIG. 2.

FIGS. 3 and 4 are a top and sectional schematic views of an example of a portion of an escape routing for the vertical connection interface 220 of FIG. 2. Referring to both FIGS. 3 and 4, the interface 220 includes a first component 400 stacked on a second component 300. The components 300, 400 may be any of the combination of components discussed above with reference to FIG. 1.

The first component 400 includes circuitry (such as circuitry 114 shown in FIG. 1) terminating at a plurality of first exposed conductors (i.e., bond pads) 430. The first exposed conductors 430 are disposed on a first side 432 of the first component 400.

The second component 300 is stacked below the first component 400. The second component 300 includes escape routing (included in the circuity 114 of the second component 300) terminating at a plurality of second exposed conductors (i.e., bond pads) 302. The second exposed conductors 302 are disposed on a second surface 434 of the second component 300. The first surface 432 of the first component 400 faces the second surface 434 of the second component 300. The second exposed conductors 302 exposed on the second surface 434 are covered by the first component 400. Such as shown in FIG. 2, the first and second exposed conductors 302, 430 are arranged in a plurality of rows and columns.

A plurality of solder connections, such as the solder connections 108, 122 shown in FIG. 1, mechanically coupled the first surface 432 of the first component 400 to the facing second surface 434 of the second component 300. Each solder connection also electrically couples a unique one of the discreet conductors 302 exposed on the first component 400 to a unique one of the discreet conductors 430 exposed on the second component 300 comprising the interface 220. As the first component 400 overlays the second component 300, the positional location of the exposed conductors 302 of the second component 300 may be made with reference to the one of the edges of the first component 400, as shown by the dashed line 418 in FIG. 4 extending through the second component 300 that is co-linear with the edge 204 of the first component 400. Thus as illustrated in FIGS. 3 and 4, the exposed conductors 302, 430 in the edge region 212 closest to the edge 204 of the first component 400 are orientated in the first row $260_1$, while the exposed conductors 302, 430 immediately farther from the edge 204 are arranged in a second row $260_2$, with additional rows 260 of exposed conductors 302, 430 being disposed towards the interior region 214 of the first component 400 away from the edge 204.

The circuitry 114 formed in the second component 300 generally includes a substantially horizontal routings 304 and substantially vertical routings (e.g., vias) 406 separated by one or more dielectric layers 404. Circuitry 114 coupled to solder connections utilized as ground pins 118 generally have the solder connection coupled through the exposed conductor 434 by a via 406 to one or more ground layers 402 formed in the first component 400. The horizontal routings 304 that coupled to vias 406 having different depths "h" are separated by at least one ground layer 402. Since horizontal routings 304 coupled to exposed conductors 302 disposed in the first row $260_1$ can be routed easily out from under areal extent of the first component 400, the first row $260_1$ generally requires fewer, if any, vias 406, for example, compared to horizontal routings 304 coupled to exposed conductors 302 disposed in rows 260 that are closer to the interior region 214.

Moreover, rows 260 closer to the interior region 214 generally have vias 406 that have a larger depth "h" as compared to rows 260 closer to the edge region 212. For example, the via 406 coupled to the exposed conductor 302 in row $260_4$ has a depth "h" shorter than the via 406 coupled to the exposed conductor 302 in row 2608. Thus on average, rows 260 in the edge region 212 have shorter via depth "h" as compared to rows 206 in the edge region 214.

One of the major contributors to crosstalk in the circuitry 114 is the proximity between the routings 304, 406. The horizontal routings 304 are substantially shielded from crosstalk at least in the vertical direction by the ground layers 402. However, since only a few of the vias 406 (i.e., those vias 406 connected to the ground pins 118) are coupled to the ground layers 402, the vias 406 utilized for transmitting communication or data signals through the signal pins 116 are much more susceptible to crosstalk. The susceptibility to crosstalk may be described by aggregated mutual inductance exhibited by the effected via 406.

Pictorially, aggregated mutual inductance may be visualized as an area surrounding a subject signal carrying via bounded on one side by adjacent signal carrying via and bounded on the other side by the closest ground carrying via. For example as shown in FIG. 4, an area 410 represents the aggregated mutual inductance for the via 406 in row $260_7$, an area 412 represents the aggregated mutual inductance for the via 406 in row $260_6$, and an area 414 represents the aggregated mutual inductance for the via in row $260_2$. As can be deduced from the relative differences in the extent of the area 410, 412, 414, the size of the area, and thus the aggregated mutual inductance, increases with the distance from the nearest ground carrying via 406 and the depth "h" of the via 406. Since the depth "h" of the via 406 is difficult to minimize due to the number of layers required to route the horizontal routings 304 of a particular escape configuration, a methodology described below can be employed to reduce the distance of vias from the nearest ground carrying via 406 without unnecessarily sacrificing an excess number of signal carrying via 406. As a result, high density of signal pins 116 may be advantageously realized without exceeding crosstalk limits.

The aggregated mutual inductance may also be expressed mathematically. For example referring to the signal pin 116 in row $260_3$, the aggregated mutual inductance $M_{ij}$ may be express as:

$$M_{ij} = \Sigma \, \text{Ln}[S_i S_j / S_{ij}]$$

where:

$S_i$ is the distance between the subject signal pin 116 in row $260_3$ and the nearest ground pin 116;

$S_{ij}$ is the distance between the subject signal pin 116 in row $260_3$ and adjacent signal pin 116 to the opposite of the nearest ground pin 116 to subject signal pin 116; and $S_j$ is summation of $S_i$ and $S_{ij}$.

To illustrate how the aggregated mutual inductance may be utilized to determine placement of ground pins 118 within the interface 220, exemplary ground and signal pin layouts are depicted in FIGS. 5-8 illustrating different ratios of ground pins 118 to signal pins 116 within rows 260 comprising portion of the interface, such as a bank 210. The layouts of FIGS. 5-8 are provided to give context to a graph illustrating a relationship between crosstalk and via depth for different ground to signal ratios depicted in FIG. 9 according to the expression for aggregated mutual inductance $M_{ij}$ described above.

Figures 5, 6:
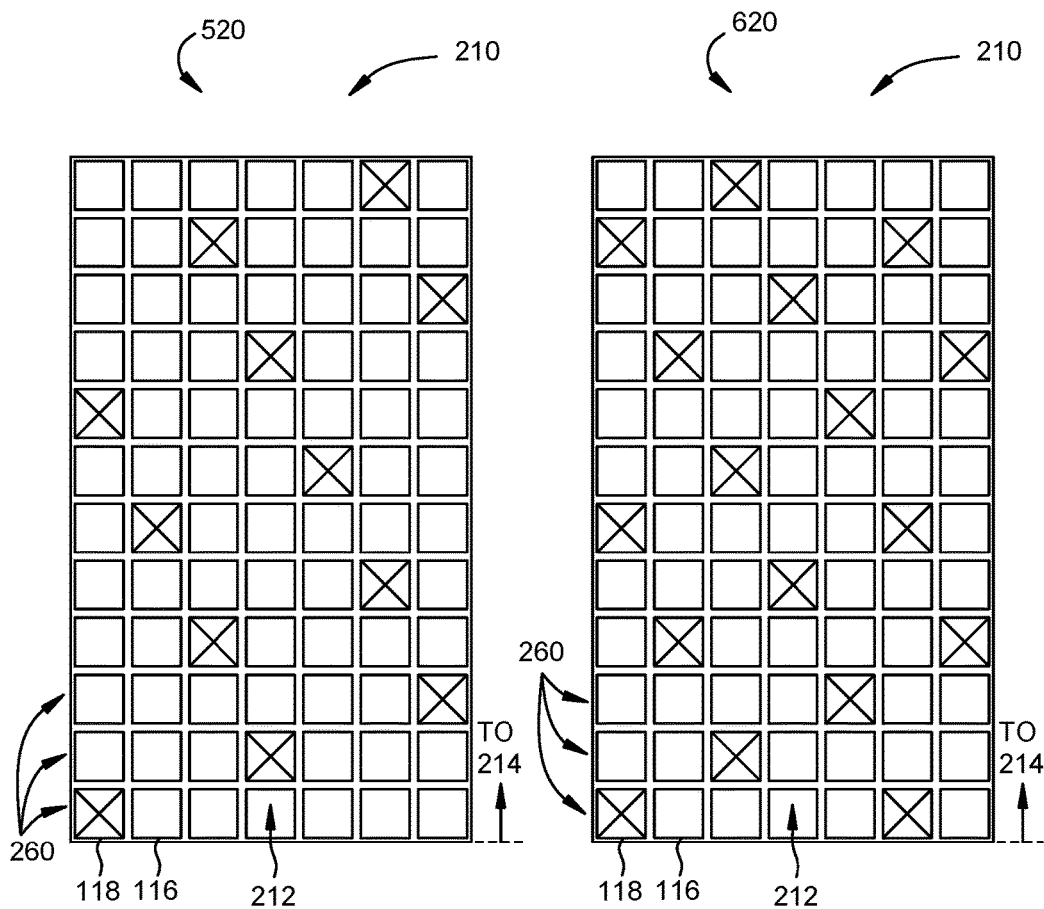
FIG. 5 is a schematic illustration of one example of an interface layout for a vertical interface between components having a ground to signal ratio of 1:6.
FIG. 6 is a schematic illustration of one example of an interface layout for a vertical interface between components having a ground to signal ratio of 1:4.

FIG. 5 is a schematic illustration of one example of an interface layout for a vertical interface 520 between components of an electronic device 110 such as shown in FIG. 1 having a ground to signal ratio of 1:6. For example, each row 260 includes at least 6 signal pins 116 for each ground pin 118. The ground to signal ratio of the ground pin 118 to signal pin 116 is substantially uniform across the bank 210.

FIG. 6 is a schematic illustration of one example of an interface layout for a vertical interface 620 between components of an electronic device 110 such as shown in FIG. 1 having a ground to signal ratio of 1:4. For example, each row 260 includes at least 4 signal pins 116 for each ground pin 118. The ground to signal ratio of the ground pin 118 to signal pin 116 is substantially uniform across the bank 210. With a higher ratio of ground pins 118 to signal pins 116 in the layout of FIG. 6 as compared to the layout of FIG. 5, the vertical interface 620 will have a lower aggregated mutual inductance $M_{ij}$ for a given via depth and, accordingly, be less susceptible to crosstalk as compared to the vertical interface 520 of FIG. 5.

FIG. 7 is a schematic illustration of one example of an interface layout for a vertical interface 720 between components of an electronic device 110 such as shown in FIG. 1 having a ground to signal ratio of 1:3. For example, each row 260 includes at least 3 signal pins 116 for each ground pin 118. The ground to signal ratio of the ground pin 118 to signal pin 116 is substantially uniform across the bank 210. With a higher ratio of ground pins 118 to signal pins 116 in the layout of FIG. 7 as compared to the layout of FIG. 6, the vertical interface 720 will have a lower aggregated mutual inductance $M_{ij}$ for a given via depth and, accordingly, be less susceptible to crosstalk as compared to the vertical interface 620 of FIG. 6.

FIG. 8 is a schematic illustration of one example of an interface layout for a vertical interface 820 between components of an electronic device 110 such as shown in FIG. 1 having a ground to signal ratio of 1:1. For example, each row 260 includes 1 signal pin 116 for each ground pin 118. The ground to signal ratio of the ground pin 118 to signal pin 116 is substantially uniform across the bank 210. And again, with a higher ratio of ground pins 118 to signal pins 116 in the layout of FIG. 8 as compared to the layout of FIG. 7, the vertical interface 820 will have a lower aggregated mutual inductance $M_{ij}$ for a given via depth and, accordingly, be less susceptible to crosstalk as compared to the vertical interface 720 of FIG. 7.

Figure 9:
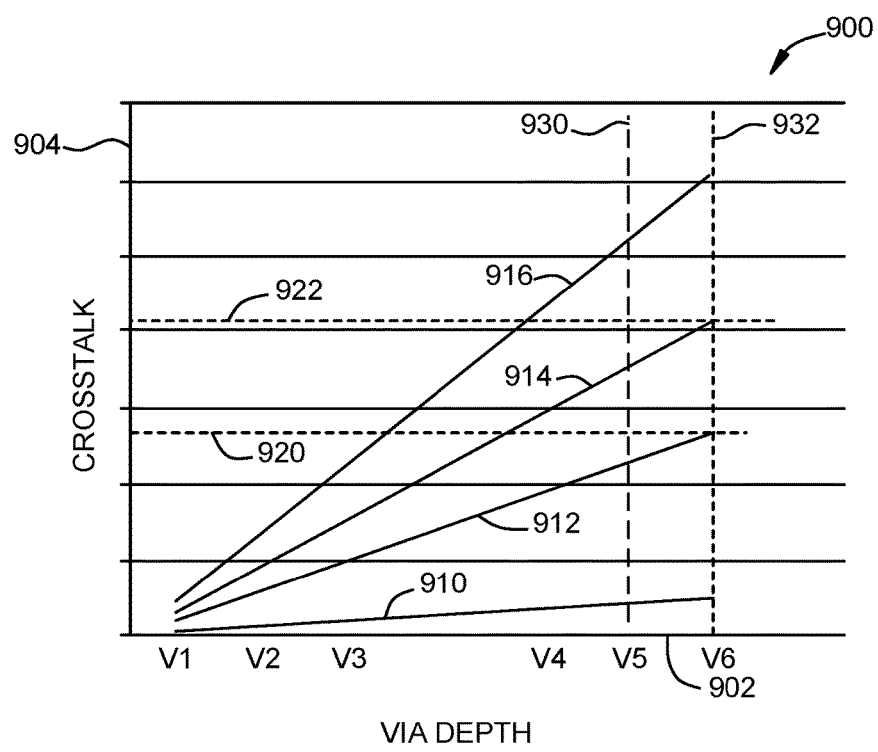
FIG. 9 is a graph illustrating a relationship between crosstalk and via depth for different ground to signal ratios.

FIG. 9 is a graph 900 illustrating a relationship between crosstalk and via depth for different ground to signal ratios. In the graph 900, the Y-axis represents crosstalk, while the X-axis represents via depth, which is shown as "h" in FIG. 4. Crosstalk may be calculated as the aggregated mutual inductance $M_{ij}$ as described above. Each plot line 910, 912, 914, 916 is the aggregated mutual inductance $M_{ij}$ for a different density of ground pins 118 to signal pins 116, i.e., the ground to signal ratio. For example, the plot line 910 is the aggregated mutual inductance $M_{ij}$ for a ground to signal ratio of 1:1, such as shown in FIG. 8; the plot line 912 is the aggregated mutual inductance $M_{ij}$ for a ground to signal ratio of 1:3, such as shown in FIG. 7; the plot line 916 is the aggregated mutual inductance $M_{ij}$ for a ground to signal ratio of 1:6, such as shown in FIG. 6.

It is evident from the graph 900 that greater via depths result in higher crosstalk. As indicated by all of the plot lines 910, 912, 914, 916, the deeper the via the higher the crosstalk. For example, the crosstalk at a via depth indicated by dashed line 932 is higher than the crosstalk at a via depth indicated by dashed line 930. While lines 932 and 930 correspond to via depths respectively at the sixth and fifth row (i.e., rows $260_6$, $260_5$ identified as V6 and V5 in FIG. 9), the via depths for rows $260_4$, $260_3$, $260_2$, $260_1$ are also indicated along the X-axis respectively as V4, V3, V2 and V1 in FIG. 9.

It is also evident from the graph 900 that lower ground to signal ratios result in higher crosstalk. As indicated by comparison between the plot lines 910, 912, 914, 916, the higher the ground to signal ratio, the higher the crosstalk. For example, the crosstalk at a ground to signal ratio (1:1) indicated by plot line 916 is higher than the crosstalk at a ground to signal ratio (1:3) indicated by plot line 914; the crosstalk at a ground to signal ratio (1:3) indicated by plot line 914 is higher than the crosstalk at a ground to signal ratio (1:4) indicated by plot line 912; and the crosstalk at a ground to signal ratio (1:4) indicated by plot line 912 is higher than the crosstalk at a ground to signal ratio (1:6) indicated by plot line 910.

The information provided by the graph 900 may be utilized to select a desired ground to signal ratio of pins 118, 116 for a vertical interface in response to a target crosstalk threshold. By selecting the lowest ground to signal ratio that will meet the target crosstalk threshold at a given via depth, the number of signal pins 116 may be maximized which advantageously provides a greater density of signal pins across the vertical interface. For example, if a crosstalk threshold (i.e., maximum tolerable crosstalk) is represented on graph 900 by dashed line 920, the maximum allowable ground to signal ratio may be determined for each via depth that will meet the target crosstalk threshold 920. It is clearly evident that vias having depths at rows V1, V2, V3 are below the target crosstalk threshold 920 at all of the ground to signal ratios represented by plot lines 910, 912, 914, 916. However, choosing plot line 916 that has the lowest ground to signal ratio will enable a greater number of signal pins 116 to be utilized in the corresponding rows. Similarly, at rows V4, V5, V6, plot lines 916, 914 illustrate that the target crosstalk threshold 920 is exceeded, while plot lines 912, 910 illustrate crosstalk below the target crosstalk threshold 920. However, choosing plot line 912 that has the lower ground to signal ratio will enable a greater number of signal pins 116 to be utilized in the corresponding row.

In another example, if a crosstalk threshold 922 is desired, vias having depths at rows V1, V2, V3, V4 are below the target crosstalk threshold 922 at all of the ground to signal ratios represented by plot lines 910, 912, 914, 916. However, choosing plot line 916 that has the lowest ground to signal ratio will enable a greater number of signal pins 116 to be utilized in the corresponding rows. Similarly, at rows V5, V6, plot line 916 illustrates that the target crosstalk threshold 920 is exceeded, while plot lines 914, 912, 910 illustrate crosstalk below the target crosstalk threshold 920. However, choosing plot line 916 that has the lower ground to signal ratio will enable a greater number of signal pins 116 to be utilized in the corresponding row.

Thus, the graph 900 may be utilized to select a ground to signal ratio for the pins 118, 116 that enables a crosstalk threshold to be met for a given via depth. Since the via depth may change for rows of connections that are located further from the edge of the component, the ground to signal ratio may be identified that provides the greatest number of signal pins, thereby enhancing the signal transmission pin density without comprising performance due to crosstalk. Therefore, utilizing greater ratio of ground pin to signal pin densities in locations having deeper vias, a gradient of the ratio of ground pin to signal pin density that increases from the edge region towards the center region results. However, it is contemplated that one or more rows may not always have a greater ratio relative the ratio within a row closer to the edge, the average ratio across a region (a number of rows, for example, the interior and edge region) will exhibit a gradient.

Figure 10:
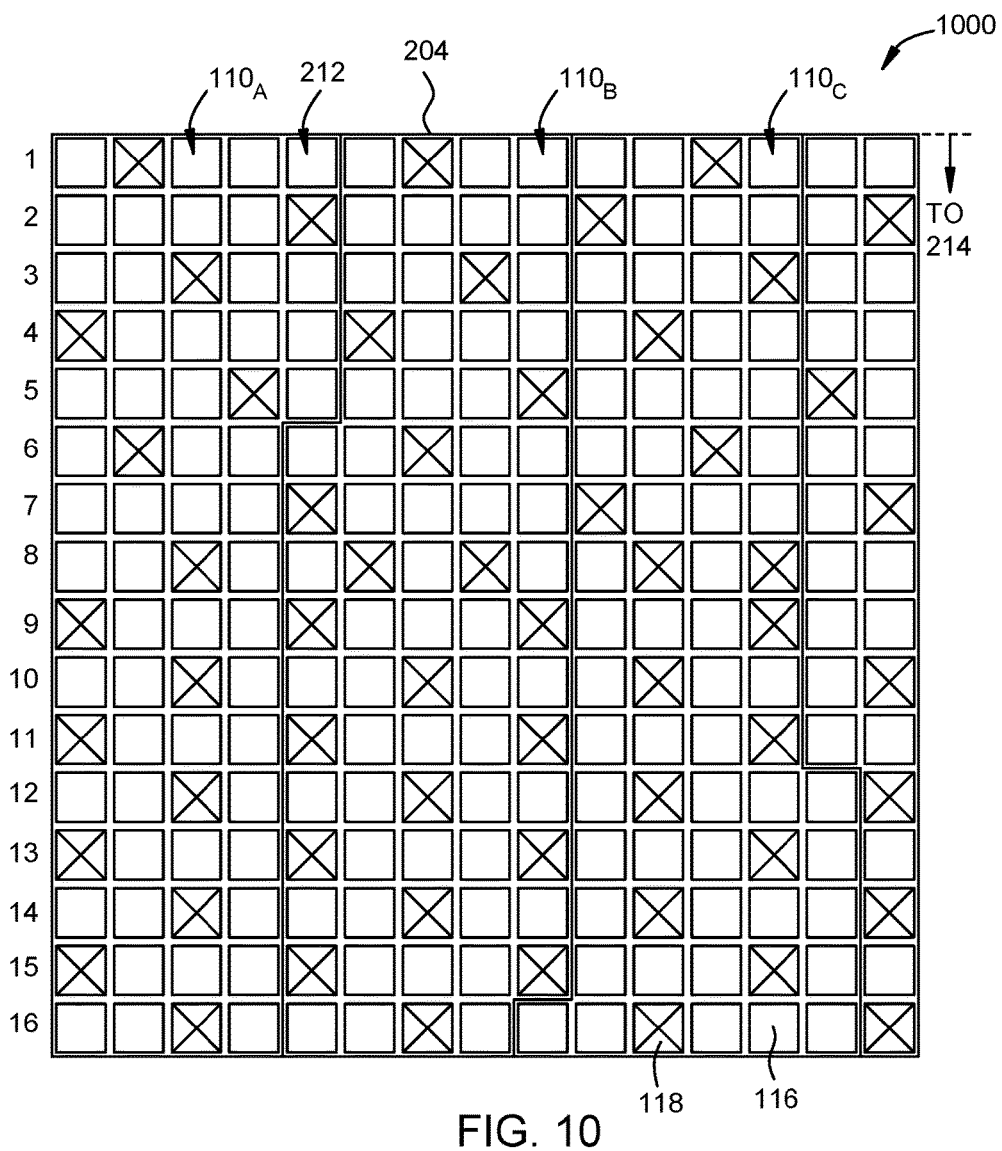
FIG. 10 is a schematic illustration of one example of an interface layout for a vertical interface between components having a ground to signal ratio that varies relative to a distance from an edge of one of the components.

FIG. 10 is a schematic illustration of one example of an interface layout for a vertical interface 1000 between components of an electronic device 110, such as shown in FIG. 1, having a ground to signal ratio that varies relative to a distance from an edge (such as edge 204) of one of the components. In one example, layout of the vertical interface 1000 may be derived using the techniques described above. In the example depicted in FIG. 10, the ground to signal ratio that varies, for example has a gradient, between the edge region 212 and the interior region 214. For example, the edge region 212 may have a lower ground to signal ratio than a ground to signal ratio of the interior region 214. The ground to signal ratio gradient between the edge region 212 and the interior region 214 may vary in a smooth or step-wise manner. For example, the ground to signal ratio of an intermediate region between the interior and edge regions 212, 214 may have a ground to signal ratio that is between the ground to signal ratios of the edge and interior regions 212, 214. In the example provided in FIG. 10, row $260_1$ through row $260_{10}$ have a ground to signal ratio of 1:4, while row $260_{11}$ through row $260_{16}$ have a ground to signal ratio of 1:3. In this manner, rows 260 closest to the edge 204 and disposed in the edge region 212 have less ground pins 118 advantageously allowing higher density of signal pins 116 while meeting crosstalk requirements, while rows 260 further from the edge 206 and closer to the interior region 214 have relatively more ground pins 118 to enable deeper vias to be utilized while still meeting crosstalk requirements.

Figure 11:
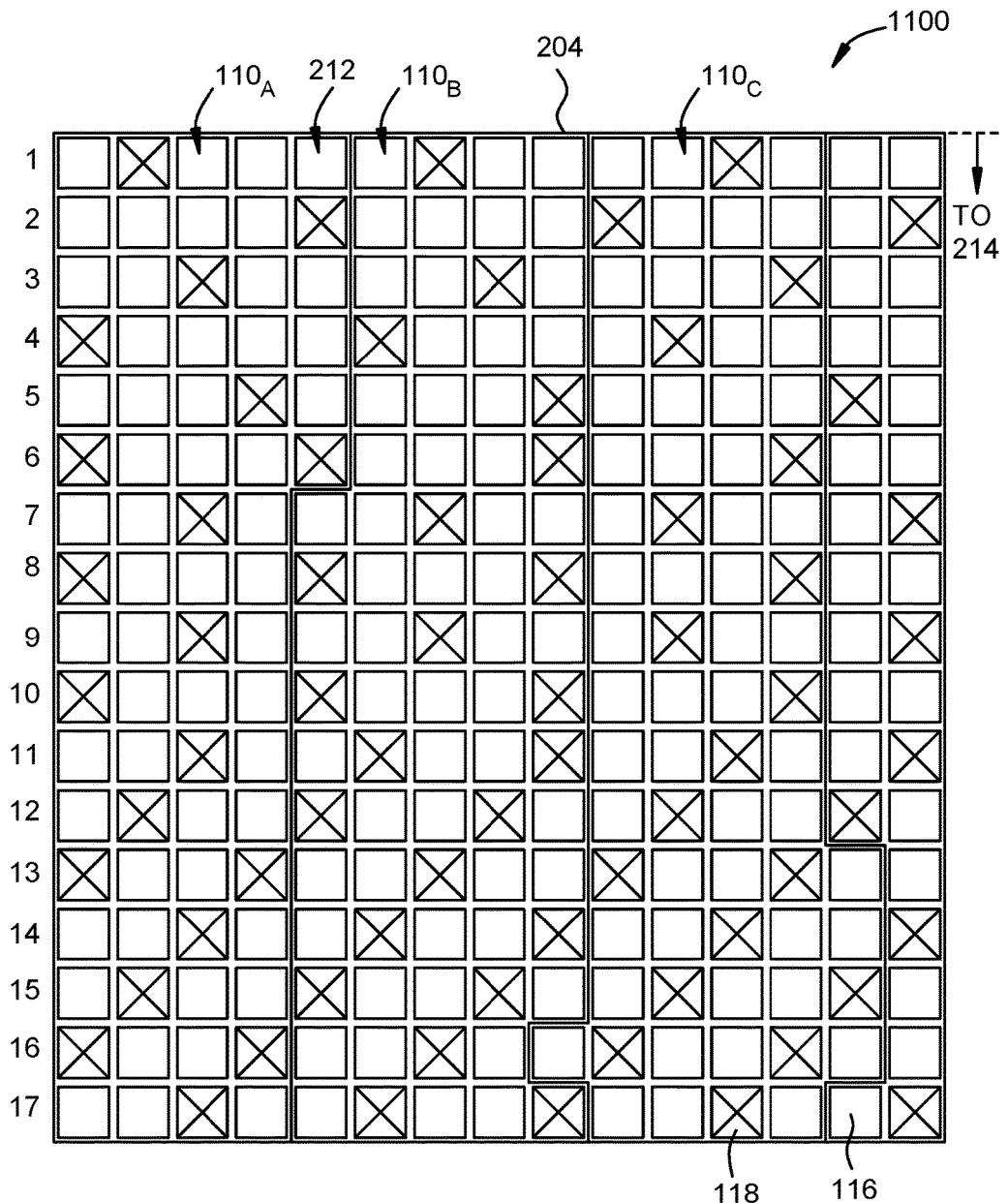
FIG. 11 is a schematic illustration of another example of an interface layout for a vertical interface between components having a ground to signal ratio that varies relative to a distance from an edge of one of the components.

FIG. 11 is a schematic illustration of another example of an interface layout for a vertical interface 1100 between components of an electronic device 110, such as shown in FIG. 1, having a ground to signal ratio that varies relative to a distance from an edge of one of the components. In one example, layout of the vertical interface 1100 may be derived using the techniques described above. In the example depicted in FIG. 11, the ground to signal ratio that varies, for example has a gradient, between the edge region 212 and the interior region 214 similar to as described above with reference to FIG. 10. For example, the edge region 212 may have a lower ground to signal ratio than a ground to signal ratio than an intermediate region, while the intermediate region has a lower ground to signal ratio than a ground to signal ratio the interior region 214. In the example provided in FIG. 11, row $260_1$ through row $260_5$ have a ground to signal ratio of 1:4, while row $260_6$ through row $260_{10}$ have a ground to signal ratio of 1:3, and row $260_{11}$ through row $260_{17}$ have a ground to signal ratio of 1:2. In this manner, rows 260 closer to the edge 204 have less ground pins 118 relative to rows 260 further from the edge 204, thereby allowing higher density of signal pins 116 and deeper vias while meeting crosstalk requirements.

It is contemplated that in FIGS. 10 and 11, that the ground to signal ratio may vary in a common row 260 between banks 210. It is also contemplated that the ground to signal ratio may be the same between common rows 260 extending through different banks 210. It is also contemplated that not every row 260 have a ground to signal ratio that is equal to or greater than a row closer to the edge. It is also to be understood that the arrangement describing the geometric relationship between solder connections 408 and pins 116, 118, is identical to the geometric relationship between the exposed conductors 302, 430 exposed on the facing surfaces of the components 300, 400.

Thus, vertical connection interfaces between stacked components of chip packages and electronic devices have been described that improve communication between the stacked components. Advantageously, increased signal connection density with reduced crosstalk may be realized by utilizing strategically denser distribution of ground connections in regions having deeper vias. Advantageously, a ground to signal ratio gradient provided by the strategic distribution of ground connection reduces the amount of ground connections needed to meet crosstalk thresholds, while increasing the amount of signal connections available for communication between components across the vertical interface.

While the foregoing is directed to embodiments of the present disclosure, other and further embodiments may be devised without departing from the basic scope thereof, and the scope thereof is determined by the claims that follow.

What is claimed is:

1. An integrated circuit device comprising:
a second integrated circuit component having a surface configured to be stacked below a first integrated circuit component, the second integrated circuit component comprising escape routing terminating at a plurality of first exposed conductors exposed on the surface of the second integrated circuit component, the first exposed conductors arranged in a plurality of rows comprising at least a first row, a second row and a third row all extending through a first bank defined among a portion of the plurality of first exposed conductors, the first row disposed parallel and adjacent to a first edge of the second integrated circuit component, the third row spaced away from the first edge, and the second row disposed between the first row and the third row, wherein a ground to signal ratio of the first exposed conductors configured to carry ground signals relative to the first exposed conductors configured to carry data signals within the first bank is greater in the third row relative to the first row.

2. The integrated circuit device of claim 1, wherein a ground to signal ratio of first exposed conductors configured to carry ground signals relative to first exposed conductors configured to carry data signals within the first bank is greater in the second row relative to the first row.

3. The integrated circuit device of claim 2, wherein the ground to signal ratio of the second row is less than the ground to signal ratio of the third row.

4. The integrated circuit device of claim 1, wherein the ground to signal ratio across the plurality of rows extending through the first bank generally is less for rows closer to the first edge relative to rows farther from the first edge.

5. The integrated circuit device of claim 1, wherein the ground to signal ratio across the plurality of rows extending through the first bank generally is less for rows having shallower vias relative to rows having deeper vias.

6. The integrated circuit device of claim 1 further comprising:
a second component comprising circuitry terminating at a plurality of second exposed conductors exposed on a second surface of the second component; and
a plurality of solder connections, each solder connection coupling a unique one of the discreet conductors exposed on the first component.

7. The integrated circuit device of claim 1, wherein the second integrated circuit component is an integrated circuit (IC) die.

8. The integrated circuit device of claim 1, wherein the second integrated circuit component is an interposer or package substrate; and
wherein integrated circuit device further comprises:
an integrated circuit (IC) die mounted to the first surface of the second integrated circuit component.

9. The integrated circuit device of claim 1, wherein the second integrated circuit component is a printed circuit board; and
wherein integrated circuit device further comprises:
an integrated circuit (IC) package mounted to the first surface of the second integrated circuit component, the IC package having one or more IC dies.

10. The integrated circuit device of claim 1, wherein the second integrated circuit component is an interposer; and
wherein integrated circuit device further comprises:
an integrated circuit (IC) die mounted to the first surface of the second integrated circuit component.

11. The integrated circuit device of claim 1, wherein the second integrated circuit component is a first printed circuit board.

12. The integrated circuit device of claim 11 further comprising:
a second printed circuit board stacked on the first printed circuit board.

13. An integrated circuit device comprising:
an integrated circuit component comprising escape routing terminating at a plurality of first exposed conductors exposed on a first surface of the integrated circuit component, the first exposed conductors exposed on the first surface arranged in a plurality of rows extending through a first bank defined among a portion of the plurality of first exposed conductors, wherein a ground to signal ratio of the first exposed conductors configured to carry ground signals relative to the first exposed conductors configured to carry data signals within the first bank has an edge to center gradient.

14. The integrated circuit device of claim 13, wherein the ground to signal ratio is greater in an interior region of the first bank having first exposed conductors coupled to deeper vias relative to an edge region of the first bank having first exposed conductors coupled to shallower vias, wherein the edge region is proximate an edge of the integrated circuit component and the interior region is spaced from the edge.

15. The integrated circuit device of claim 14, wherein the ground to signal ratio of two rows within the first bank are the same.

16. The integrated circuit device of claim 14, wherein the ground to signal ratio of rows within first bank having common depth vias are the same.

17. The integrated circuit device of claim 14, wherein the ground to signal ratio of an intermediate region of the first bank is greater than the interior region and less than the edge region, wherein the intermediate region has first exposed conductors coupled to vias shallower than vias of the interior region and deeper than vias of edge region.

18. The integrated circuit device of claim 13, wherein the integrated circuit component further comprises:
a second bank disposed laterally adjacent to the first bank, wherein an edge to center ground to signal ratio of a second bank is substantially equal to the edge to center ground to signal ratio of the first bank.

19. A method for determining an escape routing, the method comprising:
inputting a threshold crosstalk tolerance;
determining a first ground to data signal (GDS) ratio for connections coupled through first vias having a first depth in response to the threshold crosstalk tolerance;
determining a second GDS ratio for connections coupled through second vias having a second depth in response to the threshold crosstalk tolerance, the first depth greater than the second depth, and the first GDS greater than the second GDS; and
determining a third GDS ratio for connections coupled through third vias having a third depth in response to the threshold crosstalk tolerance, the second depth greater than the third depth, and the second GDS greater than the third GDS.

20. The method of claim 19 further comprising:
compiling escape routing instructions including connections configured with the first GDS, the second GDS and the third GDS.

* * * * *